(12) United States Patent
Hsu et al.

(10) Patent No.: US 7,514,740 B2
(45) Date of Patent: Apr. 7, 2009

(54) LOGIC COMPATIBLE STORAGE DEVICE

(75) Inventors: Te-Hsun Hsu, Hsinchu (TW); Yung-Tao Lin, Hsinchu (TW); Derek Lin, Hsinchu (TW); Jack Yeh, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 11/483,916

(22) Filed: Jul. 10, 2006

(65) Prior Publication Data

US 2008/0006868 A1 Jan. 10, 2008

(51) Int. Cl.
*H01L 27/108* (2006.01)
*H01L 29/94* (2006.01)

(52) U.S. Cl. .................. 257/316; 257/296; 257/300; 257/315; 257/532

(58) Field of Classification Search .......... 257/314–316, 257/532, 296, 300
See application file for complete search history.

(56) References Cited

U.S. PATENT DOCUMENTS

| | | | | |
|---|---|---|---|---|
| 5,181,188 A | * | 1/1993 | Yamauchi et al. | 365/185.08 |
| 6,034,893 A | * | 3/2000 | Mehta | 365/185.14 |
| 6,326,663 B1 | * | 12/2001 | Li et al. | 257/318 |
| 6,380,581 B1 | * | 4/2002 | Noble et al. | 257/314 |
| 6,720,596 B2 | * | 4/2004 | Ohtsuka et al. | 257/295 |
| 6,788,574 B1 | | 9/2004 | Han et al. | |
| 2002/0137281 A1 | * | 9/2002 | Watanabe et al. | 438/253 |
| 2007/0120172 A1 | * | 5/2007 | Hsu et al. | 257/315 |

* cited by examiner

*Primary Examiner*—Anh Phung
*Assistant Examiner*—Allison P Bernstein
(74) *Attorney, Agent, or Firm*—Slater & Matsil, L.L.P.

(57) ABSTRACT

A non-volatile memory cell includes a floating gate over a semiconductor substrate, a first capacitor comprising a first plate, the floating gate, and a dielectric therebetween, a second capacitor comprising a second plate, the floating gate, and a dielectric therebetween, a third capacitor comprising a third plate connected to the floating gate, and a fourth plate, wherein the third and fourth plates are formed in metallization layers over the semiconductor substrate. The first plate of the first capacitor includes a first doped region and a second doped region in the semiconductor substrate. The non-volatile memory cell further includes a transistor comprising a gate electrode over the semiconductor substrate, wherein a source/drain region of the transistor is connected to the first doped region of the first capacitor.

16 Claims, 8 Drawing Sheets

LOGIC COMPATIBLE STORAGE DEVICE

TECHNICAL FIELD

This invention relates generally to semiconductor devices, and more particularly to memory cells, and even more particularly to the structure and manufacturing methods of non-volatile memory cells.

BACKGROUND

A non-volatile memory cell retains information stored in the memory cell even when the power is turned off. To create a non-volatile memory cell, typically a standard CMOS-based logic process is used as a starting foundation. Next, additional process steps are incorporated into the logic process flow to create the non-volatile memory cell. Examples of such additional process steps include second polysilicon deposition, junction dopant optimization, etc. Integrating "non-volatile memory"-specific process steps into the standard CMOS-based logic process creates complications. Consequently, embedded non-volatile memory technologies generally lag behind advanced logic fabrication processes by several generations. For a system-on-chip (SOC) approach, which requires embedding a non-volatile memory, a design team typically has no choice but to accept a logic flow process usually two to three generations behind the current advanced standard logic process as well as an additional seven to eight lithographic masks added to that process. This prior approach not only typically increases the wafer cost, but it also falls short of the peak performance that the most advanced standard logic process can deliver.

Also, due to the cycling-induced degradation of the $SiO_2$, the previous technique of subjecting all of the non-volatile memory cell components to higher program and erase voltages typically hastens the degradation of the $SiO_2$, thus degrading the performance and reliability of the non-volatile memory cell.

Structures and fabrication methods have therefore been explored to solve the above-discussed problems. U.S. Pat. No. 6,788,574 discusses a non-volatile memory cell 400. A top view is illustrated in FIG. 1. The non-volatile memory cell 400 consists of a tunneling capacitor 406, a coupling capacitor 402 and a read transistor 404. These three components share a common floating gate 408. The plates of the coupling capacitor 402 and the tunneling capacitor 406 that are opposite the floating gate 408 are formed by connecting respective source/drain regions of MOS devices. The transistor 404 uses the floating gate 408 as a gate electrode. The coupling capacitor 402, in conjunction with the tunneling capacitor 406, forms the charging component, which is operable to facilitate programming and erasing of information stored in the non-volatile memory cell 400. Thus, a program/erase operation enables retention of information after the power is turned off, while a read operation allows the previously stored information to be accessed after powering the memory back up. During a read operation, the information is detected using the read transistor 404.

In one embodiment, the program and erase operations of the non-volatile memory cell are achieved by electrons tunneling into and out of the floating gate 408 through the tunneling capacitor 406 to alter the charge state of the memory cell. For example, to program the non-volatile memory cell 400, a positive voltage is applied to a node 410 while a node 412 is grounded. Due to the capacitive coupling of the coupling capacitor 402 and the tunneling capacitor 406, a large voltage drop is produced across the tunneling capacitor 406, resulting in a high electric field between its two plates. When the electrical field is sufficiently high for Fowler Nordheim tunneling to occur, electrons from the active region 414 can tunnel through the insulating material between the floating gate 408 and the underlying active regions 414, and inject into the floating gate 408.

Conversely, by applying a positive voltage to the node 412 and grounding the node 410, electrons in the floating gate 408 can tunnel out of the floating gate 408, and thus the negative charge in the floating gate is reduced.

The non-volatile memory cell 400 shown in FIG. 1 suffers drawbacks, however. The memory cell 400 is not isolated from other cells in the same memory array, thus memory cells in the same memory array affect each other. If a memory cell is at a state where the transistor 404 is on, during a read operation of other memory cells in the same memory array, current still flows through the transistor 404. For the memory array, this current is undesirable and is considered a leakage current. With multiple cells in a memory array, the leakage current may be significant. To reduce the leakage current, it is preferable for each memory cell to comprise a logic circuit to control its operation. As a result, the total chip area for the memory cell and the logic circuit increases. Typically, the total area may be as great as 500 $\mu m^2$. Additionally, during the program and erase operations, electrons all tunnel through the same tunneling capacitor 406. This not only affects the reliability of the memory cell, but it also increases the chances of over-programming and/or over-erasing.

What is needed, therefore, is an improved non-volatile memory cell having reduced leakage current and requiring less chip area.

SUMMARY OF THE INVENTION

In accordance with one aspect of the present invention, a non-volatile memory cell includes a floating gate over a semiconductor substrate, a first capacitor comprising a first plate, the floating gate, and a dielectric therebetween, a second capacitor comprising a second plate, the floating gate, and a dielectric therebetween, and a third capacitor comprising a third plate and a fourth plate wherein the third and fourth plates are formed in metallization layers over the semiconductor substrate and wherein the floating gate and the third plate are interconnected. The first plate of the first capacitor includes a first doped region and a second doped region in the semiconductor substrate. The non-volatile memory cell further includes a transistor comprising a gate electrode over the semiconductor substrate, and a first and a second source/drain region substantially aligned with opposite sidewalls of the gate electrode wherein the second source/drain region is connected to the first doped region of the first capacitor.

In accordance with another aspect of the present invention, a non-volatile memory cell includes a first and a second active region, a first dielectric layer over the first active region, a second dielectric layer over the second active region, a first conductor across the first and the second active regions wherein the first conductor is separated from the first and the second active regions by the first and the second dielectric layers, respectively, each of the first and the second active regions comprising a first and a second doped region on opposite sides of the first conductor wherein the first and the second doped regions in the second active region are interconnected, a third dielectric layer on the first active region, a second conductor over the third dielectric layer, a first and a second source/drain region in the semiconductor substrate and substantially aligned with opposite sidewalls of the second conductor wherein the second source/drain region is electrically coupled to the first doped region in the first active region, and a capacitor comprising a bottom capacitor plate and a top capacitor plate in metallization layers, wherein one of the top and bottom capacitor plates is electrically connected to the first conductor.

By forming a capacitor in metallization layers, chip area is saved. Further, the transistor isolates the non-volatile memory cell from other memory cells in the same memory array, thus leakage current for the memory array is reduced. Additionally, by using different capacitors to perform the erase and program operations, the reliability of the memory cell is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel non-volatile memory cell and a method of forming the same are provided. The operations of the preferred embodiments are discussed. Throughout the various views and illustrative embodiments of the present invention, like reference numbers are used to designate like elements.

Figure 1:
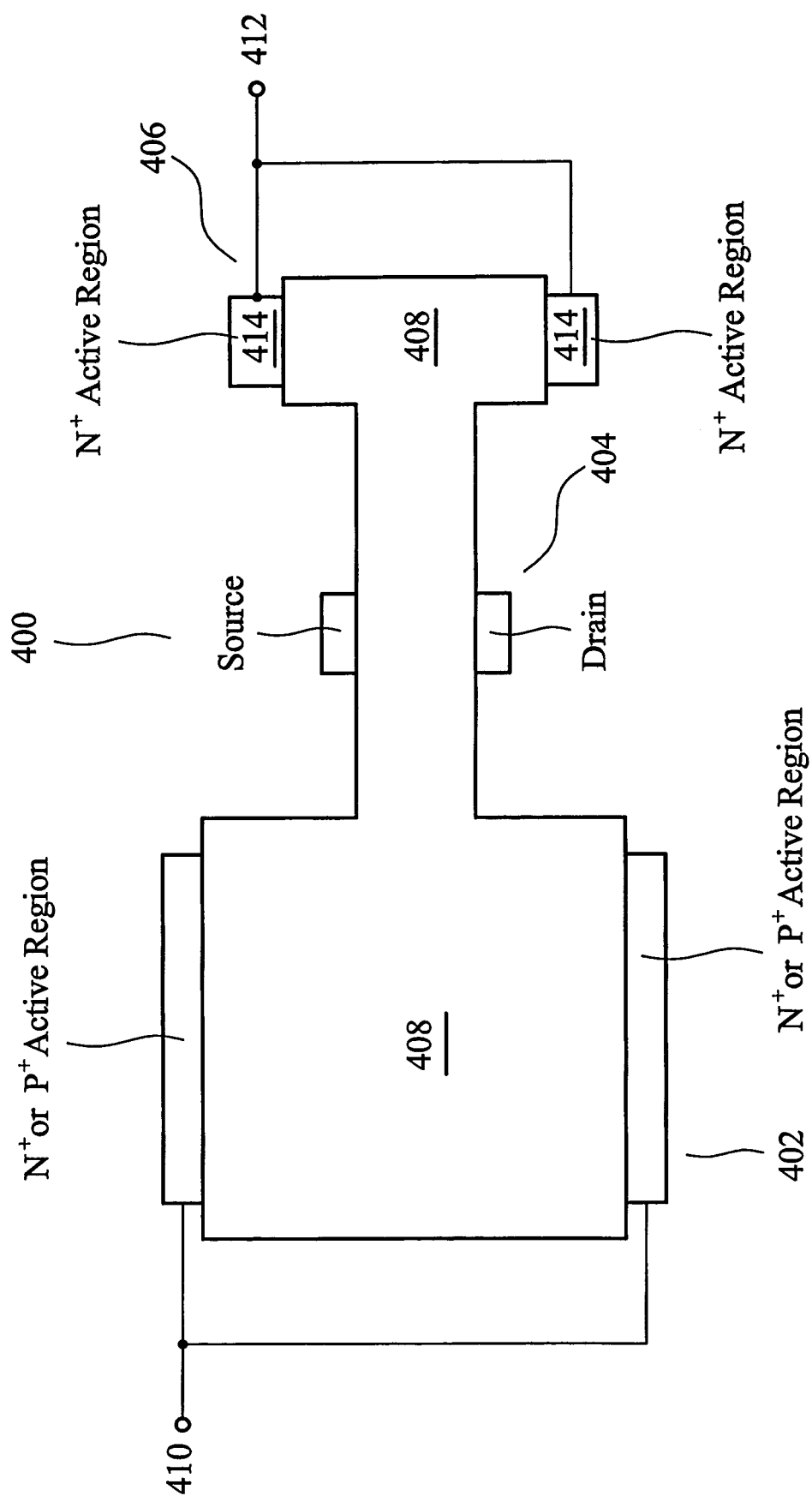
FIG. 1 illustrates a conventional non-volatile memory cell.
Figure 2:
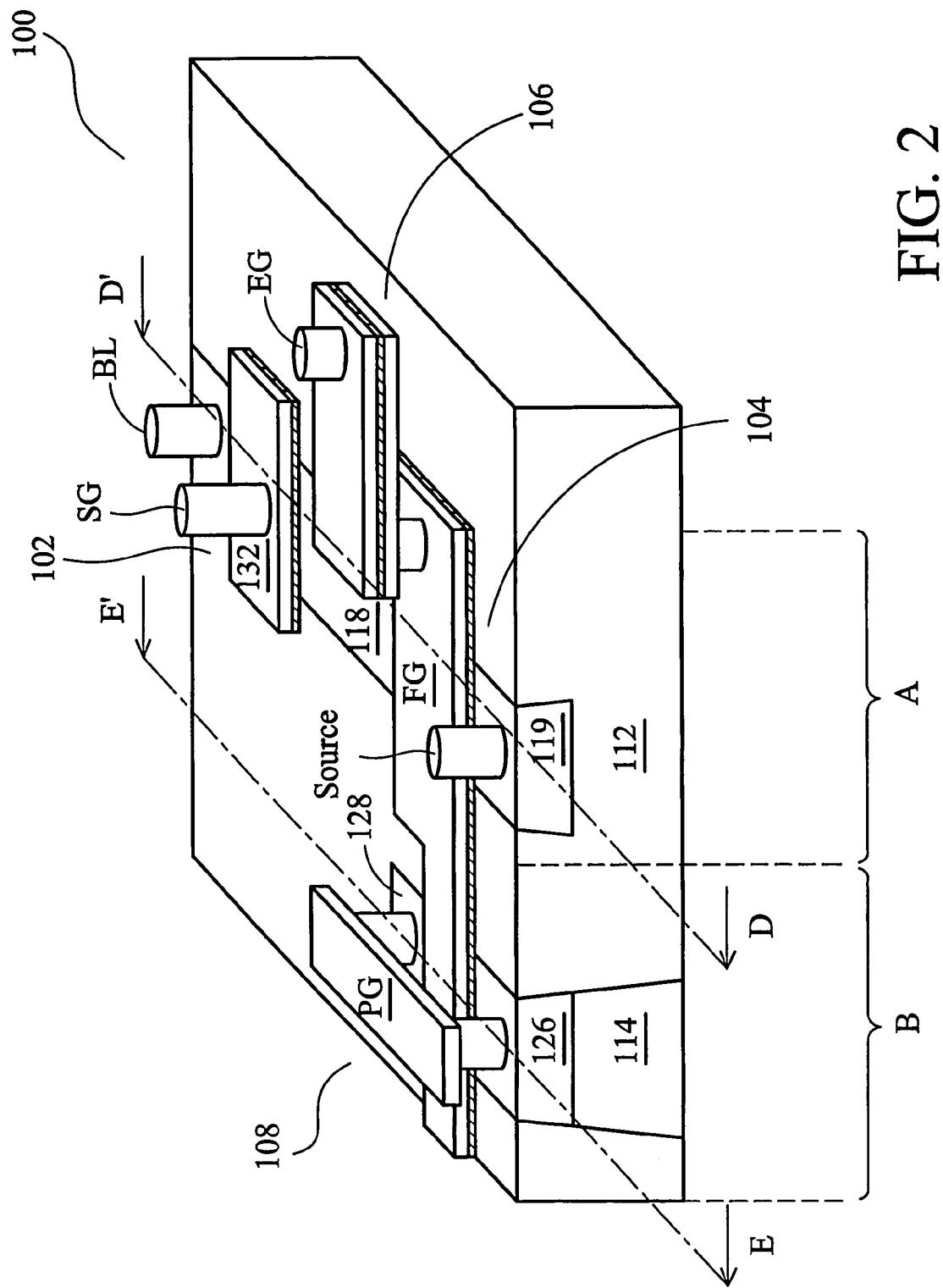
FIG. 2 illustrates a perspective view of a preferred embodiment of the present invention.

FIG. 2 illustrates a perspective view of a non-volatile memory cell 100, which comprises a transistor 102, a first capacitor (also referred to as an erase-tunneling capacitor) 104, a second capacitor (also referred to as a coupling capacitor) 106, and a third capacitor (also referred to as a program-tunneling capacitor) 108. The first capacitor 104 and third capacitor 108 share a common floating gate FG. The non-volatile memory cell 100 includes two regions, a region A comprising the transistor 102 and the first capacitor 104 and a region B comprising the third capacitor 108.

Figure 3:
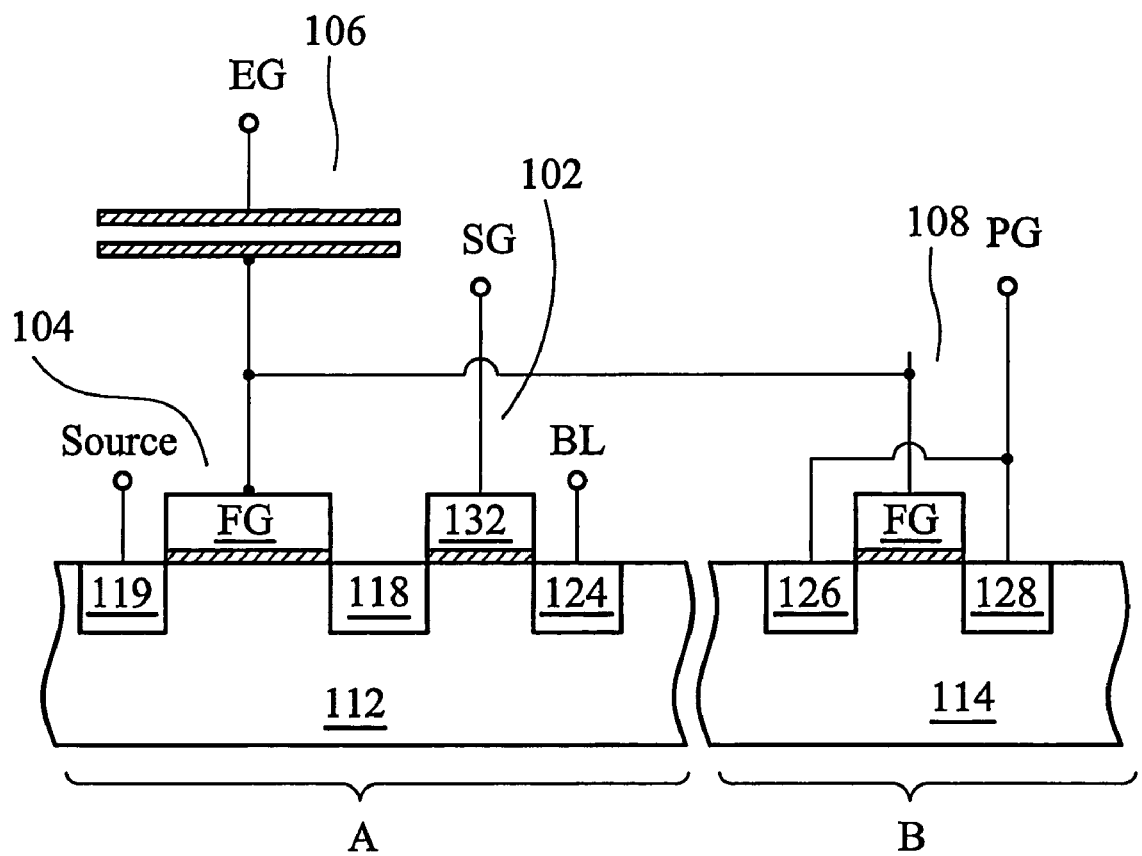
FIG. 3 schematically illustrates a cross-sectional view of the embodiment shown in FIG. 2.

FIG. 3 illustrates a cross-sectional view of the memory cell 100, wherein the cross-sectional views of regions A and B are taken along vertical planes that intersect lines D-D' and E-E' in FIG. 2, respectively. For simplicity purposes, throughout the description, the cross-sectional views of regions A and B are shown as in one plane, although they may be in different planes. Note that the floating gate FG spans across regions A and B, forming one of the two plates of the first capacitor 104 and the third capacitor 108. The doped regions 118 and 119 and the well region 112 therebetween form another plate of the capacitor 104. The floating gate FG is interconnected to a plate of the capacitor 106, and the other plate of the capacitor 106 is connected to an erase gate (EG). Doped regions 126 and 128 are interconnected, forming another plate of capacitor 108, and are connected to a program gate (PG). A gate electrode 132 of the transistor 102, which is connected to a selection gate (SG) of a memory array, controls whether memory cell 100 is selected. A bitline (BL) is used to detect the state stored by the memory cell 100.

Figure 4:
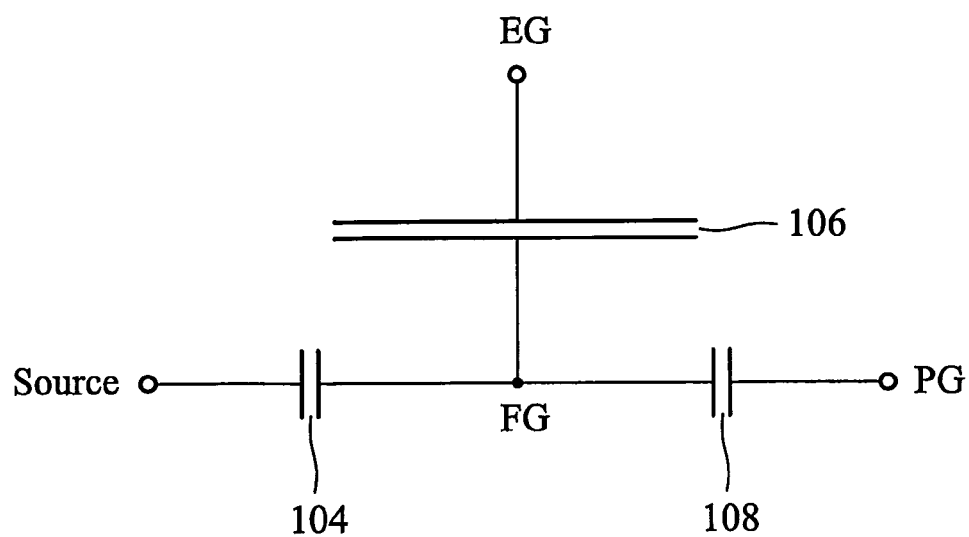
FIGS. 4 and 5 illustrate schematic equivalent circuits of the embodiment shown in FIG. 2.

An equivalent circuit of a portion of the memory cell 100 is illustrated in FIG. 4, which includes capacitors 104, 106 and 108. The sizes of the capacitors 104, 106 and 108 symbolically illustrate the relative capacitances of the respective capacitors. During the operations of the memory cell 100, different voltages are applied to the nodes Source, EG and PG, and the voltage at the floating gate FG can be calculated accordingly. Assuming the floating gate FG stores a net charge $Q_{net}$, there exists the relationship:

$$Q_{104} + Q_{106} + Q_{108} = Q_{net} \quad \text{[Eq. 1]}$$

wherein $Q_{104}$, $Q_{106}$, and $Q_{108}$ are charges stored in the capacitors 104, 106 and 108, respectively. The voltages at the nodes FG, Source, EG and PG are denoted as $V_{FG}$, $V_S$, $V_{EG}$ and $V_{PG}$, respectively, and the capacitances of the capacitors 104, 106, and 108 are denoted as $C_{104}$, $C_{106}$ and $C_{108}$, respectively. Equation 1 can thus be rewritten as:

$$(V_{FG} - V_S)C_{104} + (V_{FG} - V_{EG})C_{106} + (V_{FG} - V_{PG})C_{108} = Q_{net} \quad \text{[Eq. 2]}$$

and thus, $$V_{FG} = (Q_{net} + (V_S C_{104} + V_{EG} C_{106} + V_{PG} C_{108}))/(C_{104} + C_{106} + C_{108}). \quad \text{[Eq. 3]}$$

Therefore, the voltage $V_{FG}$ at the floating gate can be derived from Equation 3, and the operation of the memory cell 100 can be determined accordingly.

In the preferred embodiment, the erase and program operations are performed using Fowler Nordheim (FN) tunneling, in which the program operation is typically defined as the removal of electrons from the floating gate FG. Conversely, an erase operation introduces electrons into the floating gate FG. One skilled in the art will realize that the terms "erase" and "program" are terms of art, and can be defined differently.

Electrons may tunnel into or out of the floating gate FG depending on the voltages applied at the nodes Source, EG and PG. Table 1 illustrates an exemplary voltage setting for read, program and erase operations, wherein $V_{SG}$ is the preferred voltage to be applied to the selection gate SG, $V_{BL}$ is the preferred voltage to be applied to the bitline BL, and $V_B$ is the preferred voltage to be applied to the semiconductor substrate on which the memory cell 100 is built.

TABLE 1

| Voltage | $V_{SG}(V)$ | $V_{PG}(V)$ | $V_{EG}(V)$ | $V_{BL}(V)$ | $V_S(V)$ | $V_B(V)$ |
|---|---|---|---|---|---|---|
| Erase | 0 | 9 | 9 | 0 | 0 | 0 |
| Program | 0 | 9 | 0 | 0 | 0 | 0 |
| Read | 2.2 | 0 | 0 | 0.8 | 0 | 0 |

To lower the required program and erase voltages, the second capacitor 106 preferably has a greater capacitance than the first capacitor 104 and the third capacitor 108. For the convenience of discussion, throughout the description, capacitances $C_{104}$, $C_{106}$ and $C_{108}$ are assumed to have a total capacitance of C, and the capacitances $C_{104}$ and $C_{108}$ are assumed to be 0.08 C and 0.02 C, respectively, and the capacitance $C_{106}$ is assumed to be 0.9 C. Equation 3 can thus be simplified as:

$$V_{FG}=Q_{net}/C+(0.08V_S+0.9V_{EG}+0.02V_{PG}).  \quad [Eq. 4]$$

From Table 1, it is found that during the program operation, $V_{PG}$=9V, $V_{EG}$=0V, and $V_S$=0V, therefore, $$V_{FG}=Q_{net}/C+(0.08*0+0.9*0+0.02*9)=Q_{net}/C+0.018V. \quad [Eq. 5]$$

Assuming that $Q_{net}$ is zero before programming, $V_{FG}$ equals about 0.018V. Since $V_{PG}$=9V, the voltage $V_{PG}$ at node PG is higher than the voltage $V_{FG}$ by about 7.82V, which is high enough to trigger Fowler Nordheim (FN) tunneling in capacitor 108. Electrons therefore tunnel through the capacitor 108, moving out of the floating gate FG and into the program gate PG.

With the loss of electrons, the floating gate FG contains more positive charges, and $Q_{net}$ increases. From Equation 5, it is found that when $Q_{net}$ increases, voltage $V_{FG}$ rises, and the voltage difference between the nodes PG and FG is reduced. When the voltage difference ($V_{PG}$-$V_{FG}$) reduces to a certain level that is less than the voltage required for FN tunneling, the FN tunneling stops.

On the other hand, at the beginning of the program operation, voltage difference ($V_{FG}$-$V_S$), which is applied on capacitor 104, is about 0.018 volts, which is not enough for FN tunneling in either direction. During the program operation, $V_{FG}$ rises. However, the voltage difference $V_{FG}$-$V_S$ is still less than the required voltage for FN tunneling. Therefore, the net effect is that the floating gate FG contains more and more positive charges during the program operation.

The erase operation can also be analyzed by applying the voltages in Table 1 to Equation 3. From Table 1, it is found that during the erase operation, $V_{PG}$=9V, $V_{EG}$=9V, and $V_S$=0V, therefore, $$V_{FG}=Q_{net}/C+(0.08*0+0.9*9+0.02*9)=Q_{net}/C+8.28V. \quad [Eq. 6]$$

Assuming at the beginning of the erase operation, $Q_{net}/C$ is positive, ($V_{FG}$-$V_S$) is greater than about 8.28V, which is high enough for FN tunneling through capacitor 104, so that electrons tunnel through the capacitor 104 into the floating gate FG. The voltage $V_{FG}$ lowers with the introduction of electrons into the floating gate FG, until the point where the reduction of net charge $Q_{net}$ in the floating gate FG causes the voltage ($V_{FG}$-$V_S$) to be lower than the voltage required for FN tunneling, and FN tunneling stops.

On the other hand, voltage $V_{PG}$ is high, thus the voltage difference ($V_{PG}$-$V_{FG}$) is lower than the voltage required for FN tunneling. Therefore, no electrons tunnel through the capacitor 108. As $V_{EG}$ equals $V_{PG}$, no electrons tunnel through the capacitor 106 either.

Please note that while the previous analysis gives a brief description of one of the possible operations of the preferred embodiment, the actual operation may be different and may be more complicated. The previous discussion, therefore, should not limit the scope of the present invention.

In the preferred embodiment, the voltages $V_{PG}$, $V_{EG}$ and $V_S$ are chosen such that tunneling through the capacitors 104 and 108 stops after programming or erasing for a certain period of time. In alternative embodiments, during program operation and/or erase operation, FN tunneling does not stop with time. However, a dynamic balance is achieved, and the number of electrons tunneling into the floating gate FG equals the number of electrons tunneling out of the floating gate FG, so that the net charge $Q_{net}$ stays unchanged.

Figure 5:
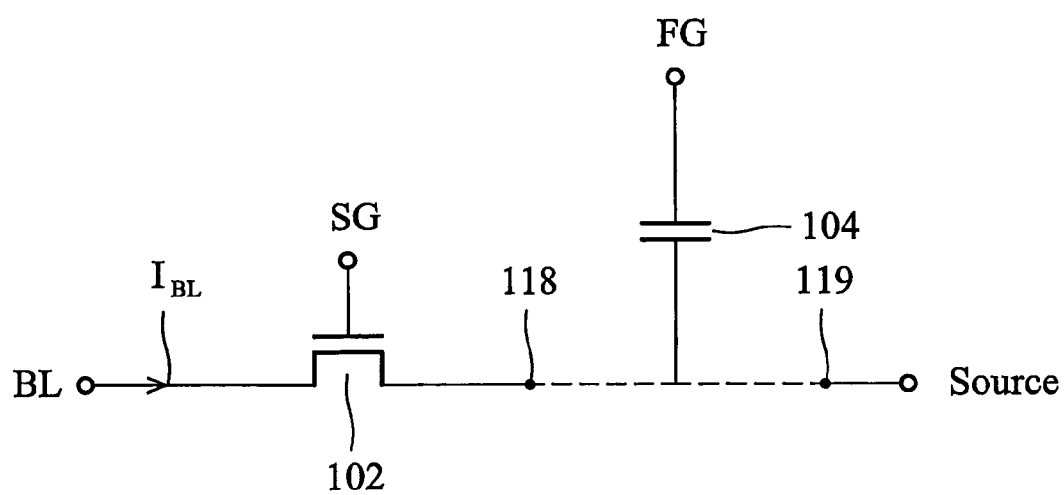

An equivalent circuit diagram for a read operation is illustrated in FIG. 5, which includes the transistor 102 and the first capacitor 104. From Table 1, it is found that $V_{PG}$=0V, $V_{EG}$=0V, and $V_S$=0V, therefore, Equation 3 becomes:

$$V_{FG}=Q_{net}/C. \quad [Eq. 7]$$

This indicates that the voltage $V_{FG}$ of the floating gate FG is determined by the charges stored. From the preceding discussion, it is known that, when erased, the floating gate FG contains holes, thus $V_{FG}$ is positive, and, when programmed, the floating gate FG contains electrons, thus $V_{FG}$ is negative. Referring to FIG. 5, when $V_{SG}$=2.2V, transistor 102 is turned on. If the floating gate FG has a positive charge, it modulates the conductance of a channel region between nodes 118 and 119 (refer to FIG. 2), and a conductive channel region therefore exists between nodes 118 and 119. When $V_{BL}$=0.8V and $V_S$=0V, a current $I_{BL}$, for example, in the order of tens of micro-amps, flows from the node BL to the node Source. Conversely, if the floating gate FG has a negative charge and $V_{FG}$ is negative, there is no conductive channel region between the nodes 118 and 119, and the current $I_{BL}$ is low, possibly in the order of pico-amps. By detecting the current $I_{BL}$, the state of the floating gate FG, hence the state of the memory cell 100, can be read.

It can be found from Equation 3 that the required voltages are related to the relative capacitances of the capacitors 104, 106 and 108. If the relative capacitance of capacitor 106 is reduced, higher program and erase voltages are required. To reduce the program and erase voltages, a greater capacitor 106 is required, which means capacitor 106 will occupy a greater area. There is, therefore, a trade off between program/erase voltage and chip area.

In the preferred embodiments of the present invention, the transistor 102 (refer to FIG. 2) isolates the memory cell from the rest of the memory cells in the same memory array that are not selected. By turning off transistor 102, no (leakage) current is drawn from the current memory cell if it is not selected. Therefore, a control circuit for the memory is not needed. This in turn significantly reduces the chip area per memory cell. Additionally, using capacitors 104 and 108 to perform erase and program operations separately, the reliability of the memory cell is improved.

FIGS. 6 through 12 illustrate cross-sectional views of intermediate stages in the manufacture of a preferred embodiment. Again, for convenience of illustration, the cross-sectional views of the regions A and B (refer to FIG. 3) are shown in one plane, and the cross-sectional views are taken from lines D-D' and E-E' in FIG. 2, respectively. Please refer to FIG. 2 for the geometry distribution of the respective features by identifying the corresponding feature numbers.

Figure 6:
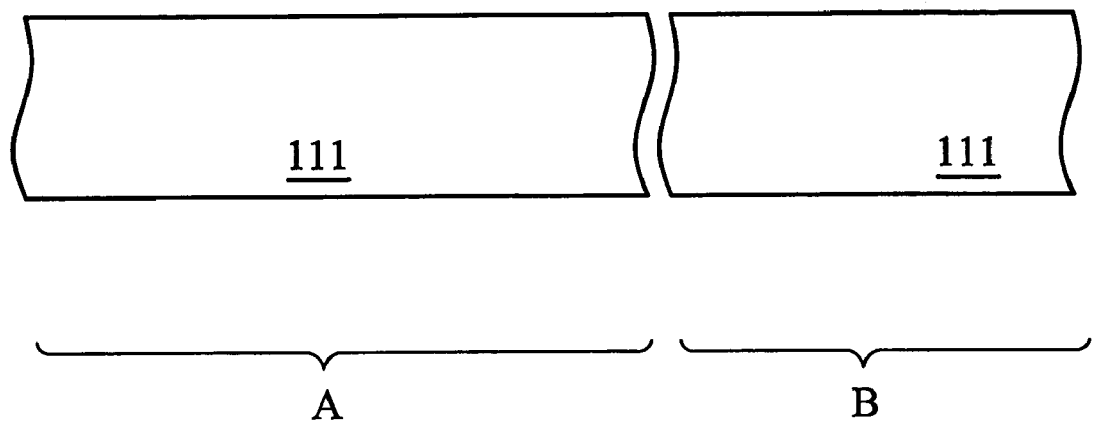
FIGS. 6 through 12 illustrate cross-sectional views of intermediate stages in the manufacture of a non-volatile memory cell.

Referring to FIG. 6, a substrate 111 is provided. The substrate 111 preferably comprises a semiconductor material such as silicon, although other semiconductor materials may be used. The substrate 111 is preferably P-type. Alternatively, the substrate 111 may comprise an N-type substrate. An N-type barrier layer (not shown) may optionally be formed.

Figure 7:
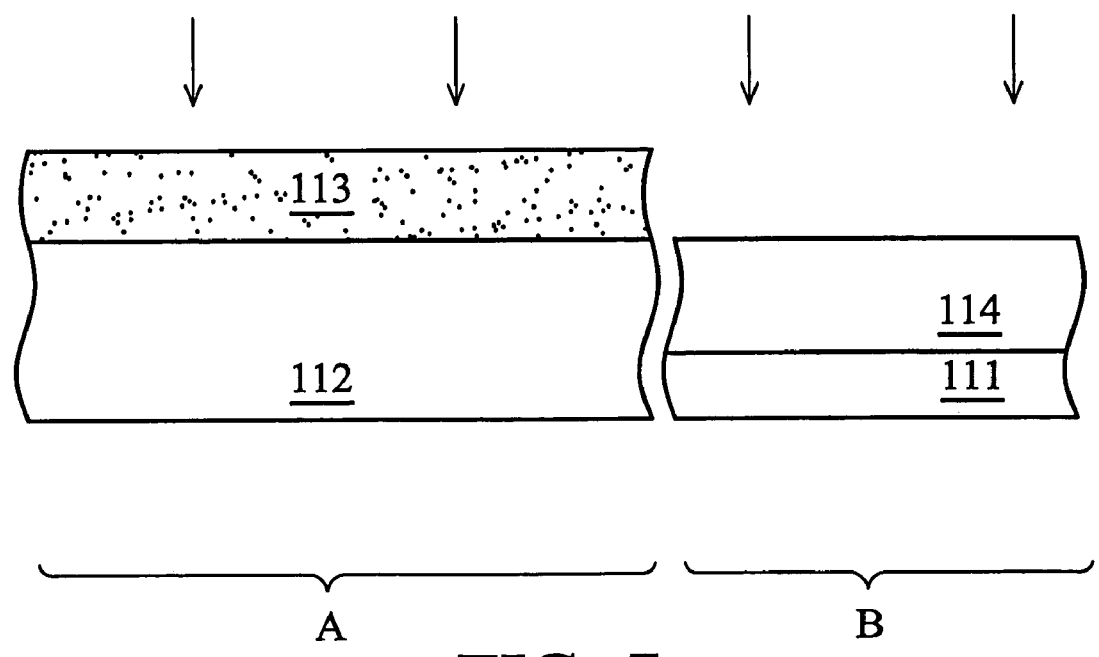

In the preferred embodiment, a photo resist 113 is formed and patterned using lithography techniques, as is shown in FIG. 7. An N-type impurity implantation is then performed to form an N-well region 114 in region B. The N-well region 114 preferably comprises antimony and/or arsenic, which neutralizes the P-type impurities in the P-type substrate 111 and converts the implanted region to N-type. Due to the masking by the photo resist 113, region A forms a P-well region 112. Photo resist 113 is then removed. In alternative embodiments, region A is not masked, and an N-well region is formed.

Figure 8:
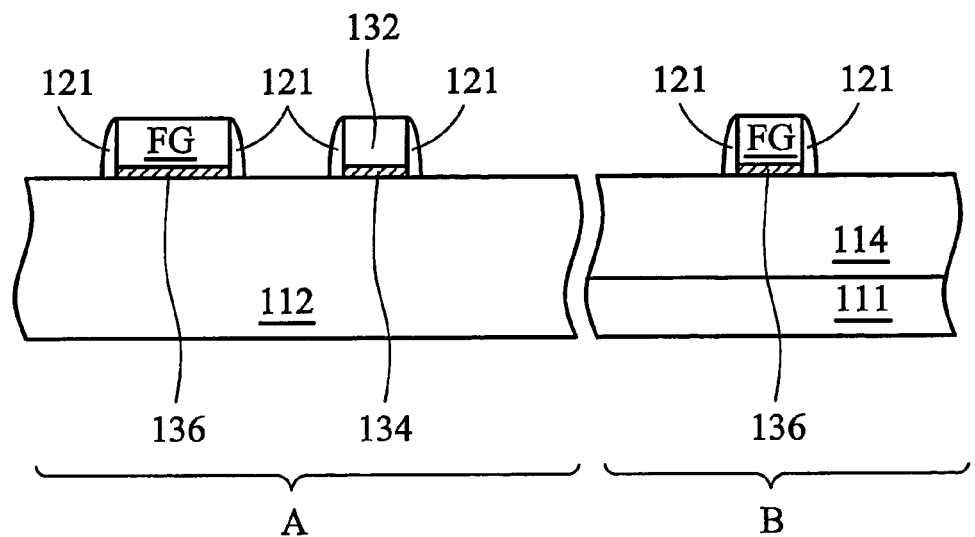

FIG. 8 illustrates the formation of gate dielectrics 134 and 136, a gate electrode 132, floating gate FG and gate spacers 121. The formation processes are well known in the art, and thus are not repeated herein. It is to be noted that the material and thickness of the gate dielectrics 136 partially determine the voltage required for tunneling. One skilled in the art will be able to find a suitable material and thickness through routine experiments. In the preferred embodiment, the gate dielectrics 136 comprise oxide, and have a thickness of between about 20 Å and about 200 Å. The gate dielectrics 136 may also have a composite structure, such as an oxide-nitride-oxide structure. Floating gate FG preferably extends throughout the regions A and B (refer to FIG. 2), although it may be formed in regions A and B separately and connected by conductive lines. The capacitances of capacitors 104 and 108 are determined by the areas of overlap regions of floating gate FG and underlying well regions in regions A and B, respectively. Preferably, the capacitance of capacitor 106 is between about 0.1 times and about 1000 times the capacitance of capacitor 104, and more preferably between about 90 times and about 95 times the capacitance of capacitor 104. The capacitance of capacitor 106 is preferably between about 0.1 times and about 100,000 times the capacitance of capacitor 108, and more preferably between about 100 times and about 1000 times the capacitance of capacitor 108. Please note that different capacitance ratios may cause different operation mechanisms, such as FN tunneling and HCI tunneling.

Figure 9:
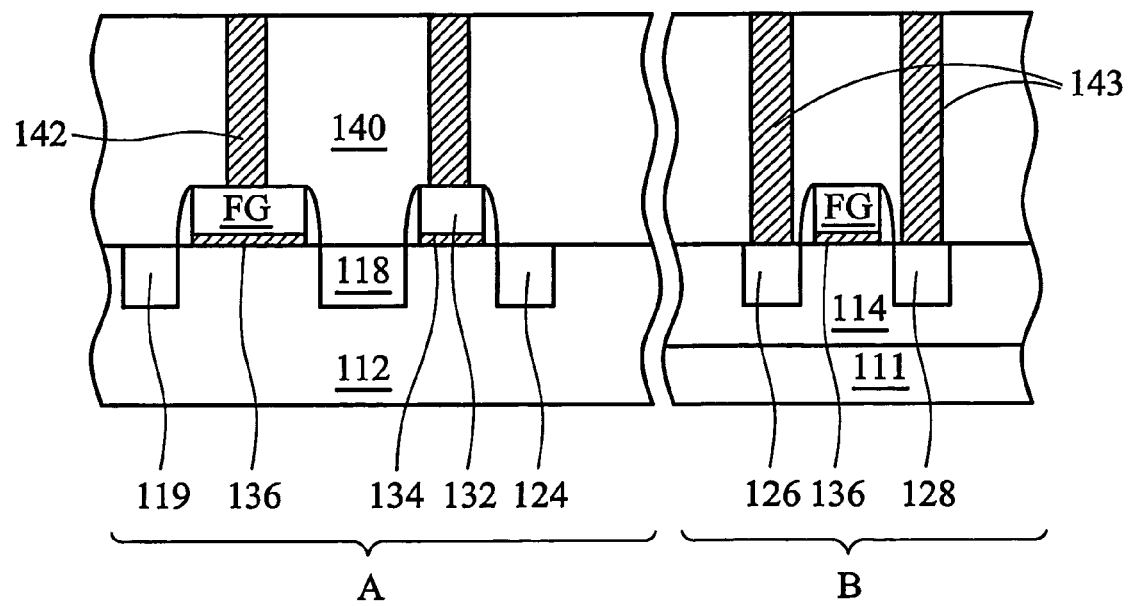

Doped regions 118, 119, 124, 126 and 128 are formed, as illustrated in FIG. 9. In the preferred embodiment wherein region 112 is a P-well region, the doped regions 118, 119 and 124 are of N-type. Otherwise, the doped regions 118, 119 and 124 are of P-type. Doped regions 126 and 128, however, may have any combination of types, and more preferably, one is of N-type and the other is of P-type. As is known in the art, P-type doped regions and N-type doped regions are preferably separately implanted with the masking of photo resists (not shown).

FIG. 9 also illustrates the formation of an inter-layer dielectric (ILD) layer 140 and contact plugs, including a contact plug 142 connected to floating gate FG. Please note that common features such as silicide regions and contact etch stop layers, which are well known in the art, are omitted. Contacts 143 are also formed to connect to doped regions 126 and 128.

Figure 10:
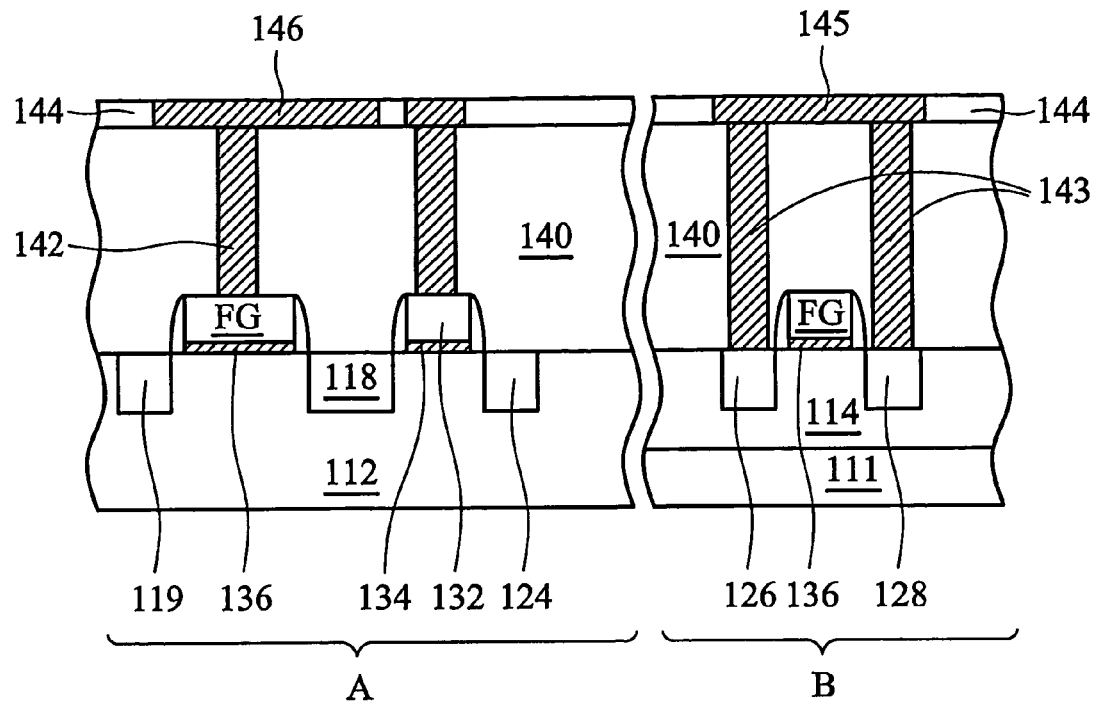
Figure 11:
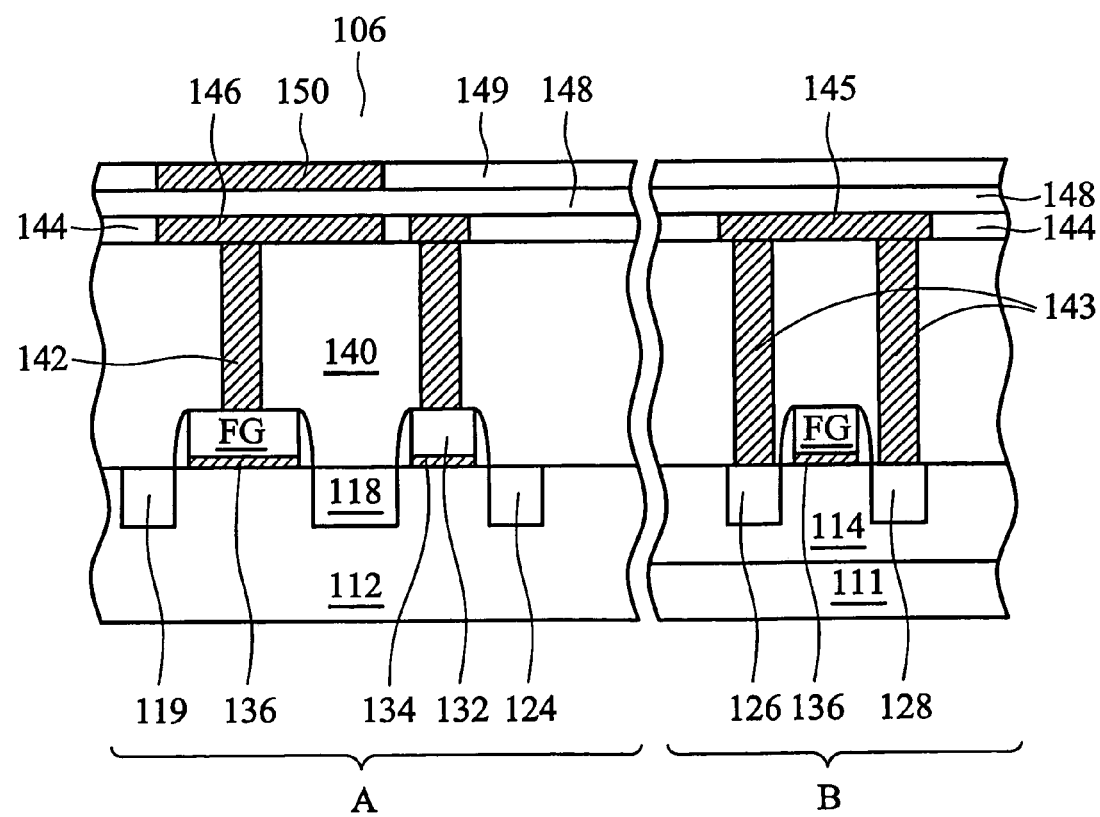

FIGS. 10 and 11 illustrate the formation of capacitor 106. Referring to FIG. 10, a bottom plate 146 is formed. In the preferred embodiment, capacitor 106 is formed using a well-known damascene process. Preferably, a first dielectric layer 144 is formed over the ILD layer 140. Openings are formed in the dielectric layer 144, and the openings are then filled with a conductive material, preferably copper or copper alloys. A chemical mechanical polish is performed to remove excess conductive material, leaving the bottom plate 146 and a metal line 145 connecting doped regions 126 and 128.

Referring to FIG. 11, an inter-metal dielectric (IMD) layer 148 is formed. Preferably, IMD layer 148 has a high k value, so that the resulting capacitor 106 has a high capacitance. However, low-k materials may be used to be compatible with the formation of other circuits on the same chip. A dielectric layer 149 is formed on the IMD layer 148, and a top electrode 150 is formed in the dielectric layer 149, preferably using a damascene process.

A capacitor 106 formed using the above-discussed process is typically referred to as a metal-insulator-metal (MIM) capacitor. Alternatively, capacitor 106 may have a structure referred to as a metal-oxide-metal (MOM) structure. It is found that in the structure shown in FIG. 11, capacitance is formed only between vertically spaced metal plates 146 and 150. However, dielectric layer 148 typically has a thickness of several thousand angstroms, thus the ability to form a great capacitor is limited. MOM capacitors solve this problem by forming additional capacitance in the same metallization layer. A memory cell comprising a MOM capacitor is shown in FIG. 12.

In each of the metallization layers comprising capacitors, a plurality of metal strips 152 and 154 are formed. Neighboring metal strips are isolated to form sub capacitors, while alternating metal strips are interconnected. In other words, all metal strips 152 are interconnected, and all metal strips 154 are interconnected. Any metal strip in the underlying metallization layer is not connected to the metal strip directly over it, so that a sub capacitor is formed vertically. Therefore, any metal strip not only forms a sub capacitor with its overlying/underlying metal strip, but also with its neighboring metal strips. The total capacitance is the addition of all sub capacitors. Since the neighboring strips may have smaller spacings, for example, about 2000 Å or less, the overall capacitance is greater than a MIM capacitor occupying a same chip area. One skilled in the art will realize the formation steps for forming a MOM capacitor.

Figure 12:
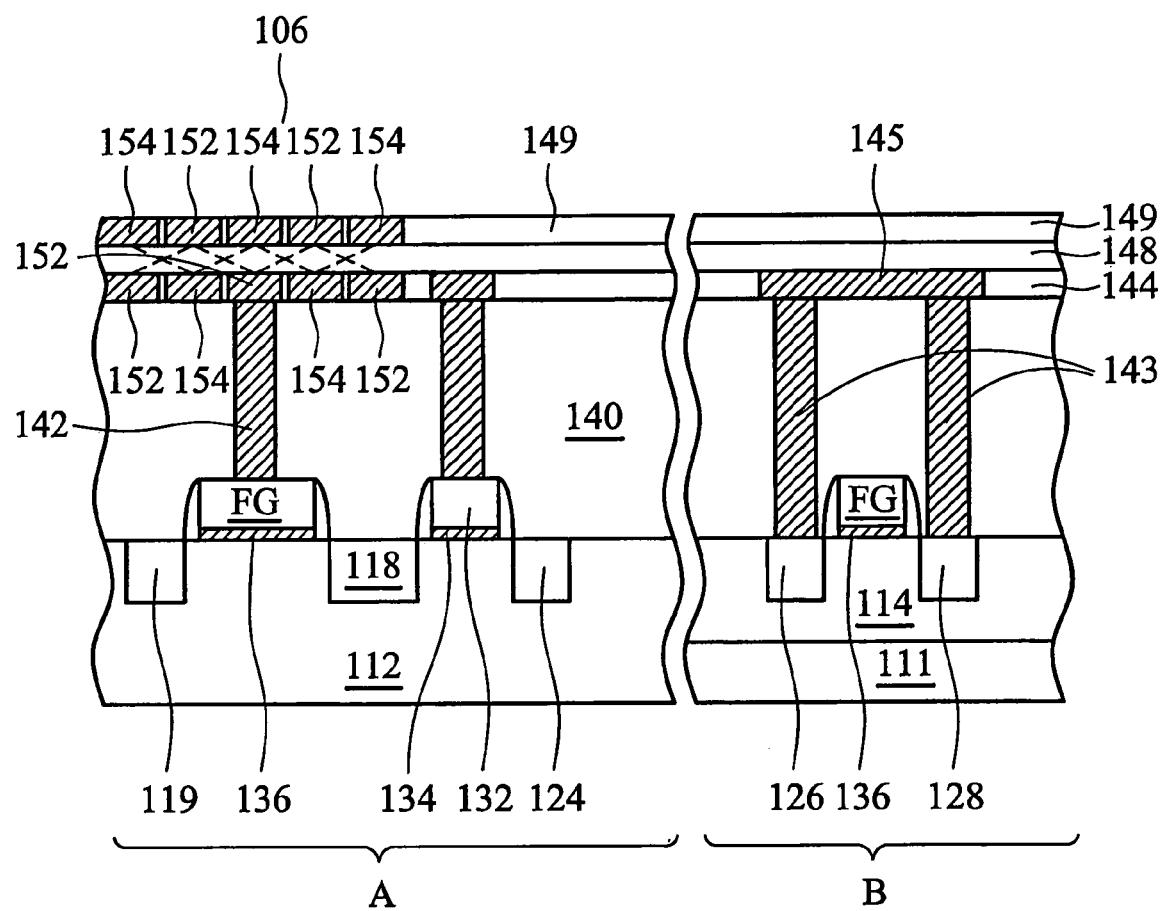

In the structure shown in FIGS. 11 and 12, capacitor 106 is formed only in metallization layers one and two. However, capacitor 106 may be formed in any two neighboring metallization layers.

In the final structure as in FIGS. 11 and 12, the top electrode is connected to an erase gate EG. Metal line 145 is connected to the voltage source PG. The source line SL is connected to the doped region 119, and the bitline BL is connected to the doped region 124. The gate electrode 132 is connected to a selection line of the memory array (not shown).

An advantageous feature of forming capacitor 106 is that, since capacitor 106 is formed in the metallization layers, the memory cell 100 has a vertical structure as compared to planar structures in conventional flash memory cells. The chip area is thus saved. Additionally, the transistor isolates the memory cell from other memory cells in the same memory array by using a selection transistor. Leakage current for the memory array is thus reduced. Additionally, by using different capacitors to perform the erase and program operations, the reliability of the memory cell is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory cell comprising:
   a semiconductor substrate;
   a floating gate over the semiconductor substrate;
   a first capacitor comprising a first plate, the floating gate, and a dielectric therebetween, the first plate comprising a first doped region and a second doped region in the semiconductor substrate;

a second capacitor comprising a second plate, the floating gate, and a dielectric therebetween, wherein the second plate of the second capacitor comprises a third doped region and a fourth doped region in the semiconductor substrate, the third doped region and the fourth doped region disposed on opposite sides of the floating gate, and the third doped region and the fourth doped region interconnected by a conductive feature;

a third capacitor comprising a third plate and a fourth plate, wherein the third and fourth plates are formed in respective metallization layers over the semiconductor substrate, and wherein the third plate is electrically connected to the floating gate; and a transistor comprising:
 a gate electrode over the semiconductor substrate; and
 a first and a second source/drain region substantially aligned with opposite sidewalls of the gate electrode, wherein the second source/drain region is connected to the first doped region of the first capacitor.

2. The memory cell of claim 1 wherein the transistor is an NMOS transistor, and wherein the first and second source/drain regions are formed in a P-well region in the semiconductor substrate.

3. The memory cell of claim 1 wherein the transistor is a PMOS transistor, and wherein the first and second source/drain regions are formed in an N-well region in the semiconductor substrate.

4. The memory cell of claim 1 wherein the third capacitor has a capacitance value of between about 0.1 and 1000 times a capacitance value of the first capacitor.

5. The memory cell of claim 1 wherein the third capacitor has a capacitance value of between about 0.1 and 100,000 times a capacitance value of the second capacitor.

6. The memory cell of claim 1 wherein each of the third doped region and the fourth doped region comprises a material selected from the group consisting essentially of P-type material and N-type material.

7. The memory cell of claim 1 wherein the gate electrode of the transistor is connected to a selection line of a memory array.

8. The memory cell of claim 1 wherein the first source/drain region of the transistor is connected to a bitline of a memory array.

9. The memory cell of claim 1 wherein the third capacitor has a metal-insulator-metal structure.

10. The memory cell of claim 1 wherein the third capacitor has a metal-oxide-metal structure.

11. An integrated circuit comprising:
 a non-volatile memory cell comprising:
  a first and a second active region;
  a first dielectric layer over the first active region;
  a second dielectric layer over the second active region;
  a first conductor spanning across the first and the second active regions, wherein the first conductor is separated from the first active region by the first dielectric layer, and the first conductor is separated from the second active region by the second dielectric layer;
  each of the first and the second active regions comprising a first and a second doped region on opposite sides of the first conductor, wherein the first and the second doped regions in the second active region are interconnected;
  a third dielectric layer on the first active region;
  a second conductor over the third dielectric layer;
  a first and a second source/drain region in a semiconductor substrate and substantially aligned with opposite sidewalls of the second conductor, wherein the second source/drain region is electrically coupled to the first doped region in the first active region; and
  a capacitor comprising a bottom capacitor plate and a top capacitor plate in metallization layers, wherein one of the top and bottom capacitor plates is electrically connected to the first conductor.

12. The integrated circuit of claim 11 wherein the first doped region and the second doped region in the second active region comprise a material selected from the group consisting essentially of P-type material and N-type material.

13. The integrated circuit of claim 11 wherein the first and the second source/drain regions are of P-type.

14. The integrated circuit of claim 11 wherein the first and the second source/drain regions are of N-type.

15. The integrated circuit of claim 11 wherein the second source/drain region and the first doped region in the first active region form a continuous region.

16. The integrated circuit of claim 11 wherein the first and the second dielectric layers form a continuous dielectric layer.

* * * * *